(12) United States Patent
Figaro et al.

(10) Patent No.: US 9,545,009 B2
(45) Date of Patent: Jan. 10, 2017

(54) PASSIVE ALTERABLE ELECTRICAL COMPONENT

(75) Inventors: Michael Edward Figaro, Golden, CO (US); Scott Edward Bacom, Westminster, CO (US); Jay Gregory Sherritt, Boulder, CO (US)

(73) Assignee: Spectra Logic, Corporation, Boulder, CO (US)

( * ) Notice: Subject to any disclaimer, the term of this patent is extended or adjusted under 35 U.S.C. 154(b) by 1975 days.

(21) Appl. No.: 11/752,759

(22) Filed: May 23, 2007

(65) Prior Publication Data

US 2008/0291651 A1 Nov. 27, 2008

(51) Int. Cl.
*H05K 7/00* (2006.01)
*H05K 3/00* (2006.01)

(52) U.S. Cl.
CPC ... *H05K 3/0005* (2013.01); *H05K 2201/09963* (2013.01)

(58) Field of Classification Search
CPC .................................................. H05K 3/0005
USPC .................... 361/782, 828, 768, 803, 777
See application file for complete search history.

(56) References Cited

U.S. PATENT DOCUMENTS

| | | | |
|---|---|---|---|
| 3,560,256 A * | 2/1971 | Abrams | 174/261 |
| 4,139,881 A * | 2/1979 | Shimizu et al. | 361/760 |
| 4,394,639 A * | 7/1983 | McGalliard | 337/292 |
| 4,641,113 A * | 2/1987 | Ozawa | 333/161 |
| 4,873,643 A | 10/1989 | Powell et al. | |
| 4,933,812 A * | 6/1990 | Becker | 361/540 |
| 5,701,234 A * | 12/1997 | Wong | 361/773 |
| 5,723,823 A * | 3/1998 | Bell | 174/262 |
| 5,805,428 A * | 9/1998 | Singer | 361/777 |
| 5,929,627 A * | 7/1999 | MacPherson et al. | 324/158.1 |
| 6,044,306 A | 3/2000 | Shapiro et al. | |
| 6,265,952 B1 * | 7/2001 | Kan | 333/33 |
| 6,324,066 B1 * | 11/2001 | Poh et al. | 361/760 |
| 6,877,149 B2 | 4/2005 | Teig et al. | |
| 7,051,450 B2 | 5/2006 | Raab et al. | |
| 7,062,341 B1 | 6/2006 | Karaikurichi | |
| 7,076,313 B2 | 7/2006 | Welch | |
| 7,110,849 B2 | 9/2006 | Landers et al. | |
| 7,220,921 B1 * | 5/2007 | Sakamoto et al. | 174/261 |
| 7,365,991 B2 * | 4/2008 | Aldrich et al. | 361/783 |
| 2002/0104669 A1 * | 8/2002 | Underwood et al. | 174/35 R |
| 2003/0043360 A1 * | 3/2003 | Farnworth | 355/77 |
| 2003/0052712 A1 * | 3/2003 | Comer | 326/38 |
| 2004/0106231 A1 * | 6/2004 | Wang | 438/108 |
| 2005/0230823 A1 * | 10/2005 | Ohsaka | 257/735 |
| 2005/0269590 A1 * | 12/2005 | Kohjiro et al. | 257/99 |
| 2006/0104042 A1 * | 5/2006 | Hsu | 361/793 |
| 2006/0200965 A1 * | 9/2006 | Farooq et al. | 29/426.3 |
| 2006/0209521 A1 * | 9/2006 | Li et al. | 361/782 |

* cited by examiner

*Primary Examiner* — Steven T Sawyer
(74) *Attorney, Agent, or Firm* — Kenneth Altshuler

(57) ABSTRACT

A passive electrical component is described including a substrate, at least a first, second and third electrically conductive pad, each disposed on the substrate and at least a first electrical device fixedly attached to the first pad and the second pad. The first electrical device is electrically connected to the first and second pads. The third pad is devoid of electrical connection to either the first or the second pads. The component is recognizable by both a Computer Aided Design program and an automated component assembly machine.

19 Claims, 12 Drawing Sheets

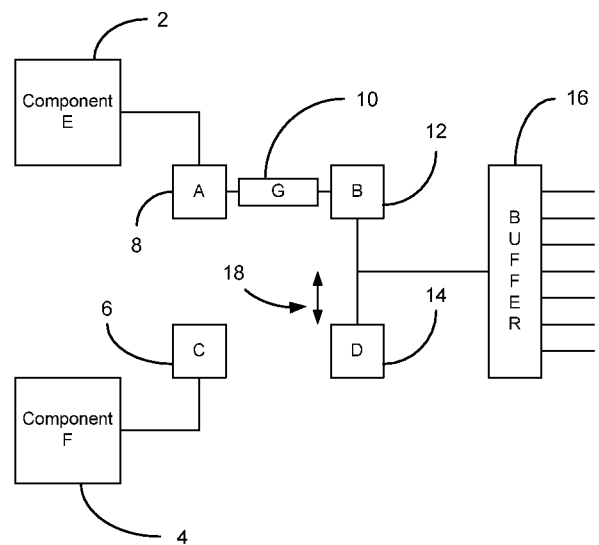
FIG. 1A  *Prior Art*
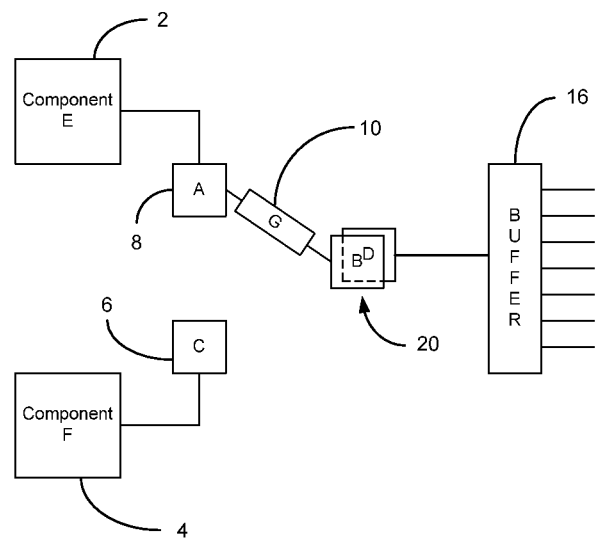
FIG. 1B  *Prior Art*

PASSIVE ALTERABLE ELECTRICAL COMPONENT

CROSS-REFERENCE TO RELATED APPLICATIONS

None

FIELD OF THE INVENTION

The present invention is directed to a passive alterable electrical component that is useful in providing flexibility with circuit board design options when using a computer aided design package that is downloadable to an automated component assembly machine.

BACKGROUND OF THE INVENTION

For years, engineers have used Computer Aided Design (CAD) programs to develop electrical component layout designs that are tailored to meet specific electrical functionality. Most CAD programs not only provide functional predictions of the electrical component layout designs but are also capable of exporting the layout designs to automated component assembly machines that build physical electrical boards of the layout designs based on the CAD layout designs. Generally, a CAD program allows for one origin location associated with each electrical component chosen in a layout design. The origin location of each component is understood by an automated component assembly machine which will, consequently, dispose each chosen electrical component on a physical electrical substrate board based on the origin location.

In certain instances, components atypically arranged in a layout may generate certain errors in some CAD programs and automated component assembly machines; FIGS. 1A and 1B exemplify such an atypical layout. Shown herein is an example of one layout that includes a circuit electrically connected to a primary component and a backup component that is not electrically connected to the circuit, however, is capable of being connected to the circuit. As shown in FIG. 1A, primary component-E 2 is connected to buffer component 16 via pad-A 8, pad-B 12 and component G 10. As shown backup component-F 4 is not connected to the buffer component 16 because pad-C 6 and pad-D 14 are not connected. For example, if the primary component-E 2 generates a noise sensitive electrical signal, such as an output, the placement of pad-D 14 may be suboptimal because the termination distance 18 of pad-D 14 may cause noise generation due to signal reflection. Likewise, if component-F 4 were connected to the buffer component 16 instead of component-E 2, noise may be generated by signal reflection from pad-B 12; assuming pad-B 12 was a termination point. FIG. 1B would provide a solution to the problem for FIG. 1A because pad-B 12 and pad-D 14 are substantially superimposed, creating pad-B/D 20 thereby eliminating reflection due to the termination distance 18. The problem is some CAD programs will not allow a commonly shared pad in the location of pad-B/D 20 or overlaying pads, such as pad-B/D 20. Furthermore, attempts to download a shared pad or overlaying pads will cause certain automated component assembly machines to register an error with possibly substantial manual effort to overcome the error.

In an effort to improve the user friendliness of certain automated component assembly machines and their associated CAD programs, both methods and apparatuses are disclosed herein. It is to innovations related to this subject matter that the claimed invention is generally directed.

SUMMARY OF THE INVENTION

The present invention relates generally to a passive alterable electrical component that is useful in providing flexibility with circuit board design options when using a computer aided design package that is downloadable to an automated component assembly machine.

Embodiment of the present invention can therefore comprise a passive electrical component comprising: a substrate; at least a first, second and third electrically conductive pad, each disposed on the substrate; at least a first electrical device fixedly attached to the first pad and the second pad and making an electrical connection therebetween, the third pad devoid of electrical connection to either the first or the second pads, and wherein the component is recognizable by both a Computer Aided Design program and an automated component assembly machine.

Another embodiment of the present invention can therefore comprise a method of using a switchable passive electrical component, the method comprising the acts of: providing the component having a substrate, a first, second and third electrically conductive pad each disposed on the substrate, a first electrical device electrically connecting and fixedly attached to the first and the second pads, and wherein the third pad is devoid of electrical connection to either the first or the second pads; positioning a virtual representation of the component in a Computer Aided Design (CAD) layout such that the first pad is electrically connected to a first externally located device and the second pad is electrically connected to a second externally located device; downloading the CAD layout to an automated component assembly machine; and constructing an electrical board based on the CAD layout via the automated component assembly machine.

Yet another embodiment of the present invention can therefore comprise a component with a passive alterable electrical pathway, the component comprising: at least a first, second and third electrically conductive pad; at least a first electrical device fixedly attached to the first pad and the second pad and making an electrical connection therebetween, the third pad devoid of electrical connection to either the first or the second pads; and a substrate supporting the first, second and third pads, the substrate moveable between a first orientation and a second orientation, the first orientation having a first external device electrically connected to the first pad, a second external device electrically connected to the second pad and a third external device electrically connected to the third pad, wherein the first external device is electrically linked to the second external device and the third external device is devoid of any electrical link via the component to either the second external device or the first external device, the second orientation having the second external device electrically connected to the first pad, the third external device electrically connected to the second pad and the first external device electrically connected to the third pad wherein the third external device is electrically linked to the second external device and the first external device is devoid of any electrical link via the component to either the second external device or the third external device.

BRIEF DESCRIPTION OF THE DRAWINGS

FIGS. 1A and 1B are block diagrams of a prior art configurations.

DETAILED DESCRIPTION

Figure 2A:
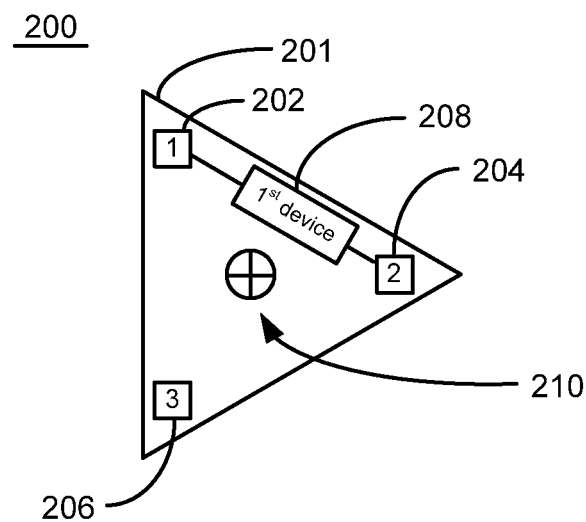
FIG. 2A is an illustration of a passive electrical component arrangement consistent with certain embodiments of the present invention.

Referring to the drawings in general, and more specifically to FIG. 2A, shown therein is a block diagram of a passive electrical component arrangement 200 constructed in accordance with an embodiment of the present invention. In what follows, similar or identical structures may be identified using identical callouts.

The passive electrical component arrangement 200 illustrated in FIG. 2A can comprise a substrate 201 and at least a first electrically conductive pad 202, a second electrically conductive pad 204 and third electrically conductive pad 206, each disposed on the substrate 201. The first pad 202 and the second pad 204 are electrically connected via at least a first electrical device 208 fixedly attached to the first pad 202 and the second pad 204. The first electrical device 208 can be fixedly attached by solder joints, adhesive, a mechanical fastener or an alternative means that prevents the first electrical device 208 from becoming disconnected, except when selectively desired. Unlike a moveable link between pads, such as a pivoting switch for example, a fixedly attached electrical device, such as the first electrical device 208, can reduce the effective discontinuity in the transmission line generated, such as through a base plane on the substrate 201 or other reference or return path (i.e. an active return path), for example. As illustrated, the first pad 202, second pad 204 and third pad 206 are arranged in a triangular array, as is the shape of the substrate 201 in this embodiment. The third pad 206 is devoid of any contact with the first pad 202 or the second pad 204 via the component 200. The component 200 provides at least one solution over the prior art of FIGS. 1A and 1B because it is recognizable to Computer Aided Design (CAD) programs (i.e., component 200 can accommodate certain programming rules in a CAD system) in addition to automated component assembly machines. The component 200 can be identifiably placed (i.e., identified and placed), in the virtual sense by a CAD program or in the actual construction of an electrical board assembly, based on an origin location 210. In one embodiment of the present invention, the component 200 (or any like component within the scope and spirit of the present invention) is sealed. A sealed component can be a component that is substantially sealed with a polymer resin which, in yet another embodiment, hermetically seals the component. The component by virtue of being sealed can be protected from flash heat, light, environmental contamination, environmental elements, such as air, water, etc. Another embodiment of a sealed component can be a component that is substantially encased in plastic covering (or other material providing the same function) wherein the covering can, in one embodiment, conform to the shape of the component, for example.

Figure 2B:
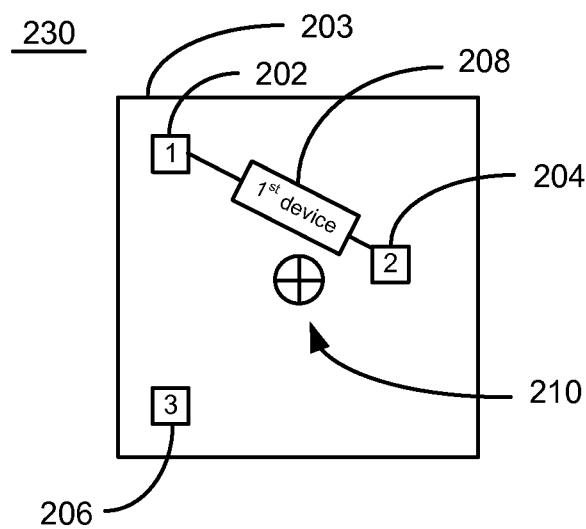
FIG. 2B shows an alternative substrate embodiment of a passive electrical component arrangement consistent with embodiments of the present invention.

FIG. 2B shows an alternative substrate embodiment of a passive electrical component arrangement 230 which is similar to the component 200 of FIG. 2A. As shown in this illustration, the component 230 has a first electrically conductive pad 202, a second electrically conductive pad 204 and third electrically conductive pad 206, each disposed on the substrate 203. The first pad 202 and the second pad 204 are electrically connected via at least a first electrical device 208 fixedly attached to the first pad 202 and the second pad 204. The third pad 206 is devoid of any contact with the first pad 202 or the second pad 204 via the component 230. As illustrated, the first pad 202, second pad 204 and third pad 206 are arranged in a triangle, though the shape of the substrate 203 in this embodiment is square. The shape of a substrate, such as the square substrate 203, can be circular, elliptical, polygonal, an any other shape so long as the substrate, such as substrate 203, provides support to pads and devices without departing from the scope and spirit of the present invention.

Figure 3A:
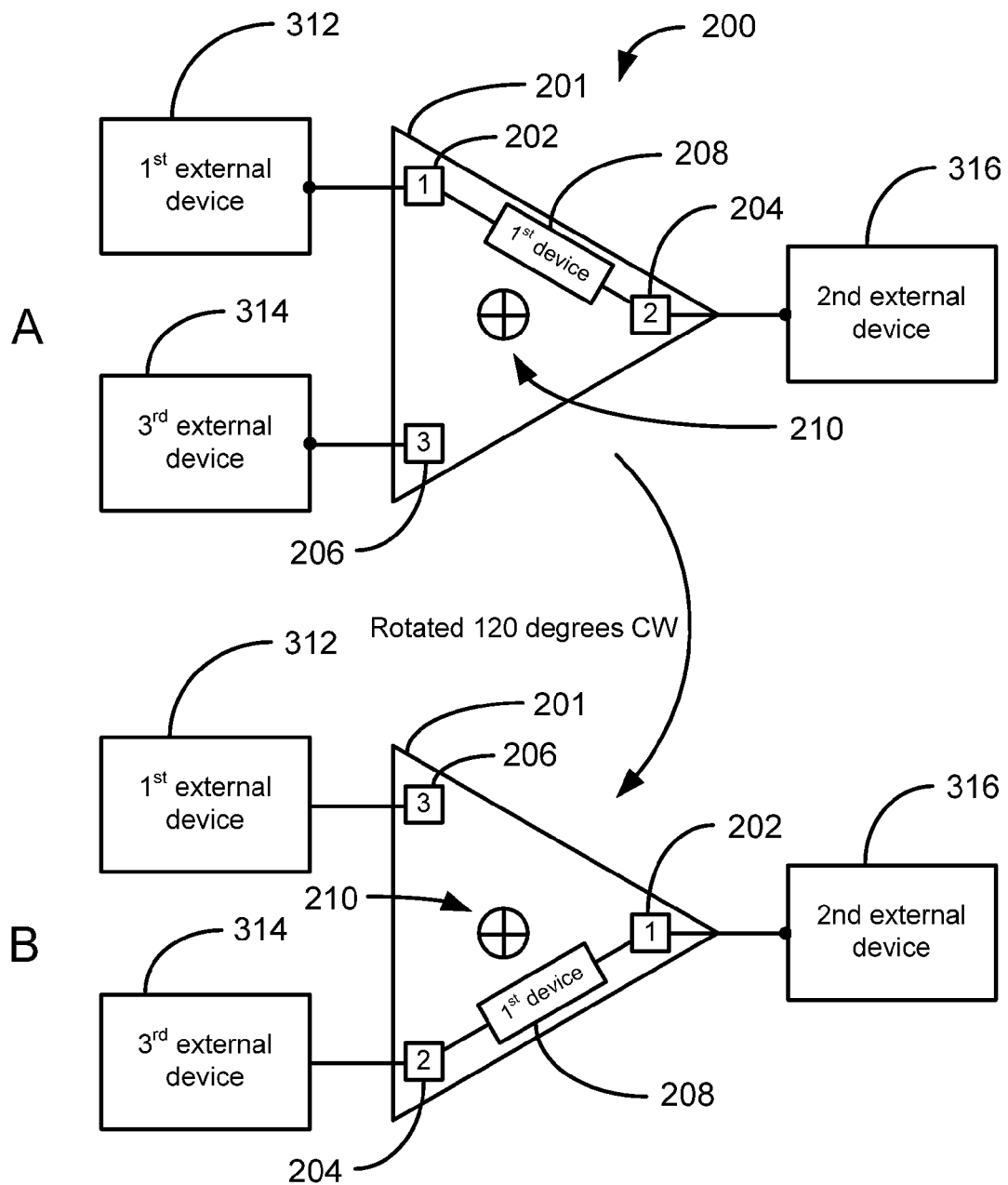
FIG. 3A is an illustration of another embodiment of the present invention showing a passive electrical component connected with external electrical devices and oriented in two optional arrangements.

FIG. 3A is an illustration of another embodiment of the present invention wherein a passive electrical component is electrically connected with external electrical devices and is oriented showing two optional arrangements. As illustrated, component 200 of FIG. 2A is electrically linked with a first external device 312, second external device 316 and a third external device 314. More specifically, in orientation A (the upper arrangement) the first external device 312 is electrically connected to the first pad 202, the second external device 316 is electrically connected to the second pad 204 and the third external device 314 is electrically connected to the third pad 206. The first external device 312 is electrically linked with the second external device 316 via the first device 208 and first and second pads 202 and 204, respectively. The third external device 314 is not linked to either the first external device 312 or the second external device 316. In orientation B (the lower arrangement), the component 200 has been rotated 120° clockwise about the origin location 210 in the same plane as the pads 202, 204 and 206. The first external device 312 is electrically connected to the third pad 206, the second external device 316 is electrically connected to the first pad 202 and the third external device 314 is electrically connected to the second pad 204. The third external device 314 is electrically linked with the second external device 316 via the first device 208 and first and second pads 202 and 204, respectively. The first external device 312 is not linked to either the third external device 314 or the second external device 316. Hence, either the first external device 312 or third external device 314 can be electrically connected to the second external device 316 via the component 200. In this embodiment, the connection to the second external device 316 via the first device 208 enjoys close to perfect controlled resistance, and minimizes any deviation from the transmission line model effect of discontinuity given a differential signal, because the fixedly attached first device 208 provides two optional paths to the second external device 316 depending on the rotation of the component 200.

Figure 3B:
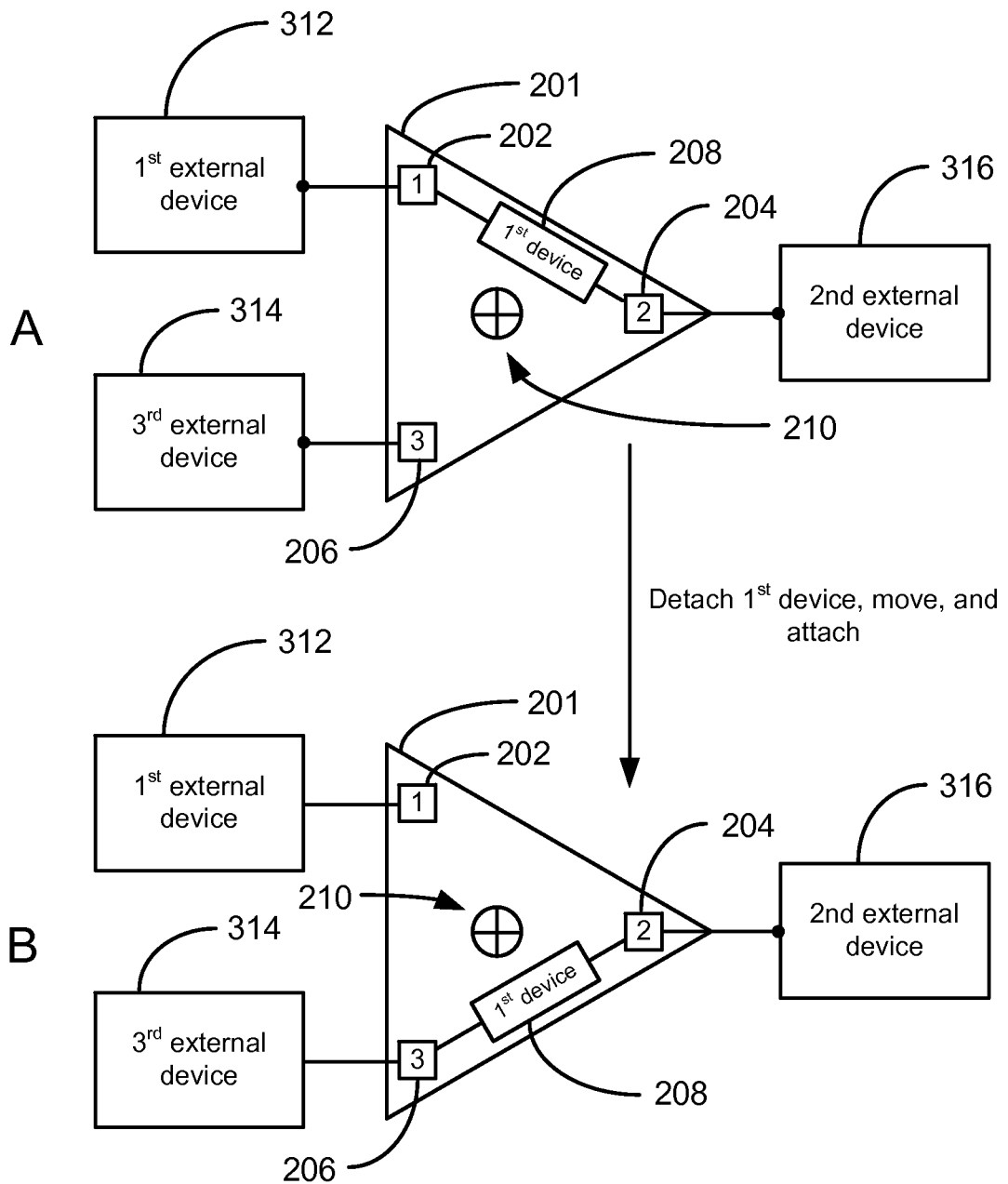
FIG. 3B is an illustration of another embodiment of the present invention wherein a passive electrical component connected with external electrical devices and constructed showing two optional arrangements.

FIG. 3B is an illustration of another embodiment of the present invention wherein a passive electrical component is electrically connected with external electrical devices and is constructed showing two optional arrangements. Arrangement A (the upper arrangement) illustrates the first external device 312 electrically connected to the first pad 202, the second external device 316 electrically connected to the second pad 204 and the third external device 314 electrically connected to the third pad 206. The first external device 312 is electrically linked with the second external device 316 via the first device 208 and first and second pads 202 and 204, respectively. The third external device 314 is not linked to either the first external device 312 or the second external device 316. In arrangement B (the lower arrangement), the first device 208 has been detached from the first pad 202 and the second pad 204 and re-attached to the third pad 206 and second pad 204. In the interest of providing an example of detaching a fixedly attached component, such as the first component 208, detachment can be accomplished by applying heat to solder joints at pads 202 and 204 and reattaching can be accomplished by soldering new joints at the pads 204 and 206 with the leads to the first device 208. Such an operation can be done by a machine or an operator. Hence, in arrangement B, the third external device 314 is electrically linked with the second external device via pad two 204 and pad three 206 and the first device 208.

Figure 3C:
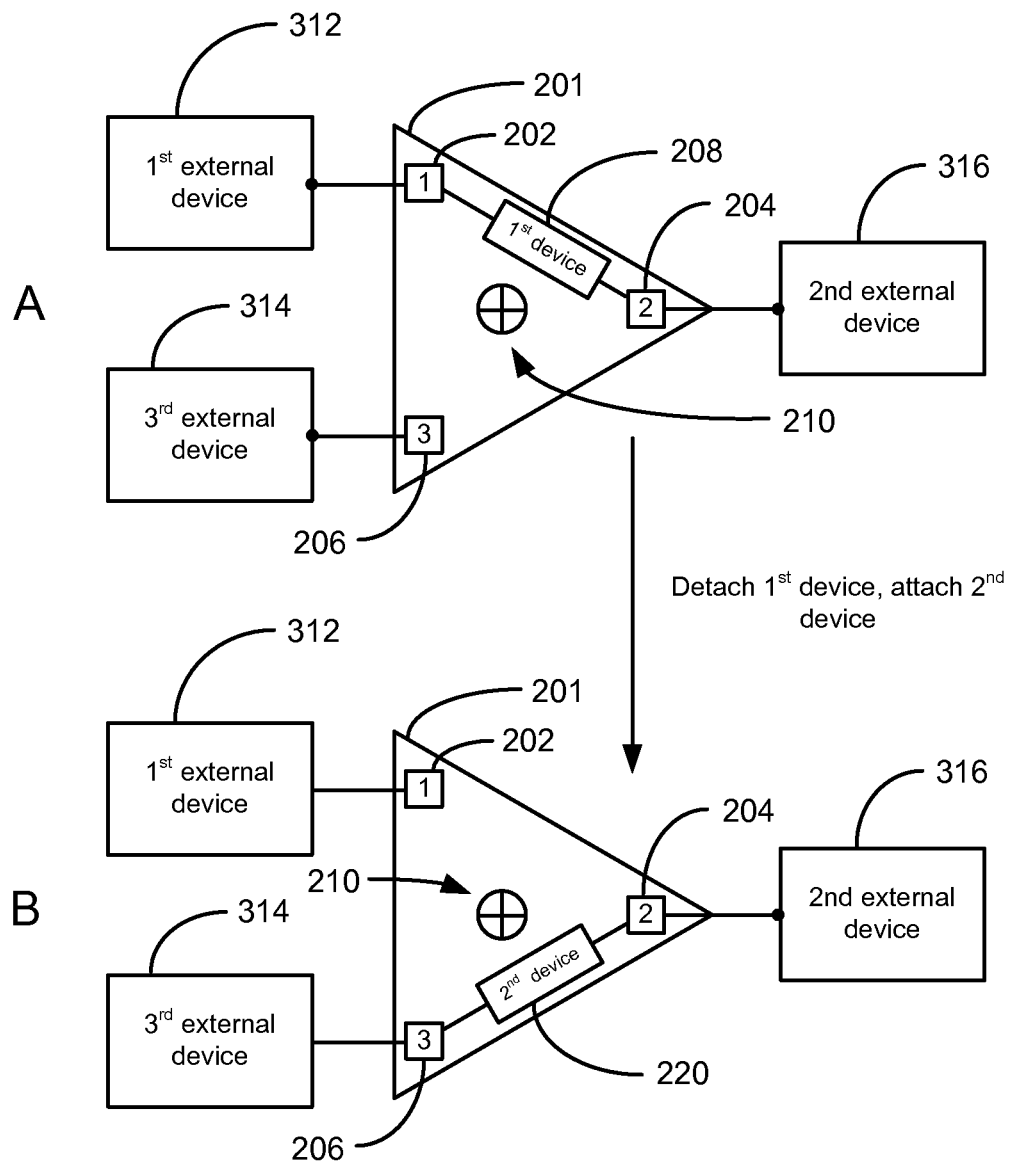
FIG. 3C is an illustration of yet another embodiment of the present invention wherein a passive electrical component connected with external electrical devices constructed showing two optional arrangements.

FIG. 3C is an illustration of yet another embodiment of the present invention wherein a passive electrical component is electrically connected with external electrical devices and is constructed showing two optional arrangements. Arrangement A (the upper arrangement) illustrates the first external device 312 electrically connected to the first pad 202, the second external device 316 electrically connected to the second pad 204 and the third external device 314 electrically connected to the third pad 206. The first external device 312 is electrically linked with the second external device 316 via the first device 208 and first and second pads 202 and 204, respectively. The third external device 314 is not linked to either the first external device 312 or the second external device 316. In arrangement B (the lower arrangement), the first device 208 has been detached from the first pad 202 and the second pad 204, and a second device 220 has been fixedly attached to the third pad 206 and second pad 204. Hence, in arrangement B, the third external device 314 is electrically linked with the second external device via pad two 204 and pad three 206 and the second device 220.

Figure 4:
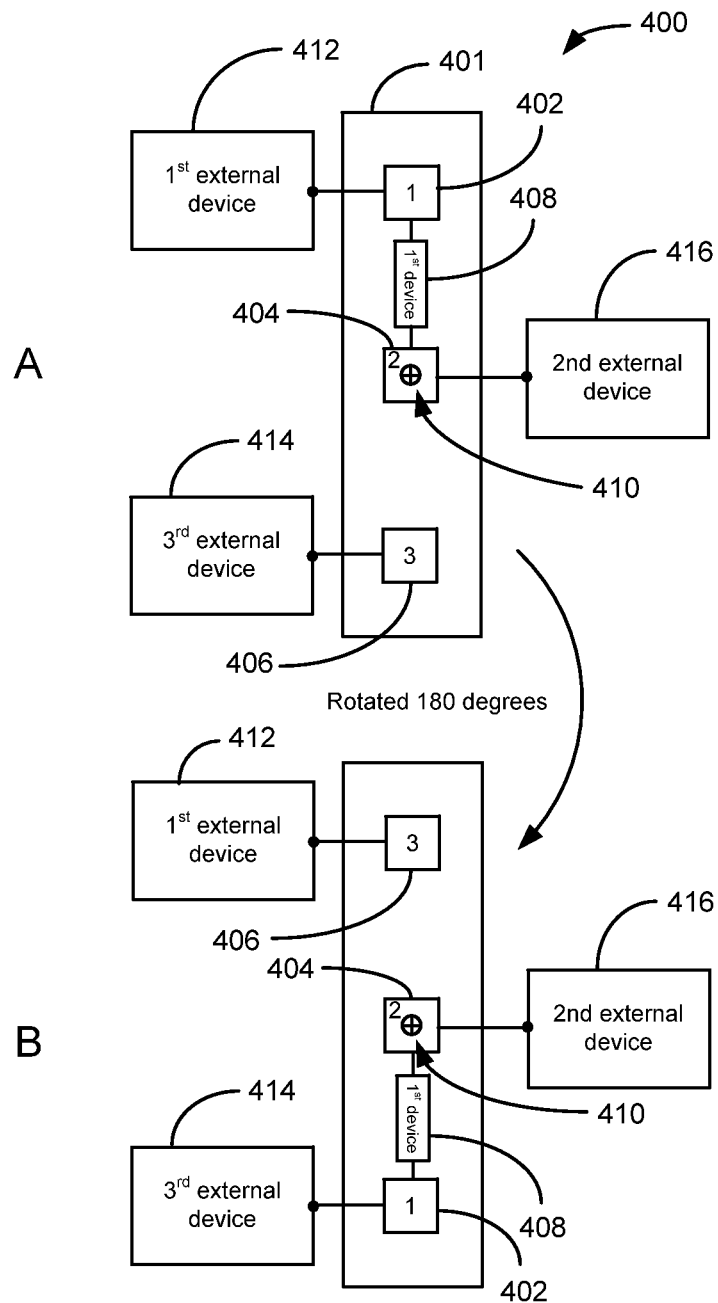
FIG. 4 is an illustration of yet another embodiment of the present invention wherein a passive electrical component is connected with external electrical devices and is oriented showing two optional arrangements.

FIG. 4 is an illustration of yet another embodiment of the present invention wherein a passive electrical component is electrically connected with external electrical devices and is oriented showing two optional arrangements. As illustrated, component 400 comprises a first electrical pad 402, a second electrical pad 404 and a third electrical pad 406 that are disposed in a linear arrangement on a rectangular substrate 401. The component 400 is electrically linked with a first external device 412, second external device 414 and a third external device 416. More specifically, in orientation A (the upper arrangement) the first external device 412 is electrically connected to the first pad 402, the second external device 416 is electrically connected to the second pad 404 and the third external device 414 is electrically connected to the third pad 406. The first external device 412 is electrically linked with the second external device 416 via the first device 408 and first and second pads 402 and 404, respectively. The third external device 414 is not linked to either the first external device 412 or the second external device 416. In orientation B (the lower arrangement), the component 400 has been rotated 180° about the origin location 410, as shown. The first external device 412 is electrically connected to the third pad 406, the second external device 416 is electrically connected to the second pad 404 and the third external device 414 is electrically connected to the first pad 402. The third external device 414 is electrically linked with the second external device 416 via the first device 408 and first and second pads 402 and 404, respectively. The first external device 412 is not linked to either the third external device 414 or the second external device 416. Hence, regarding both orientations A and B, either the first external device 412 or third external device 414 can be electrically connected to the second external device 416 via the component 400.

Figure 5A:
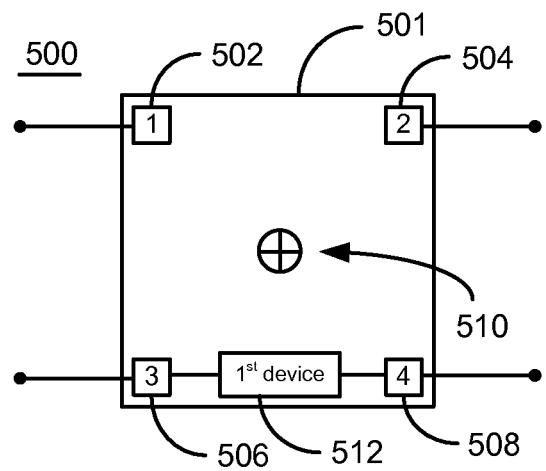
FIG. 5A-5C are illustrations of alternative embodiments of passive electrical component arrangements consistent with certain embodiments of the present invention.
Figure 5B:
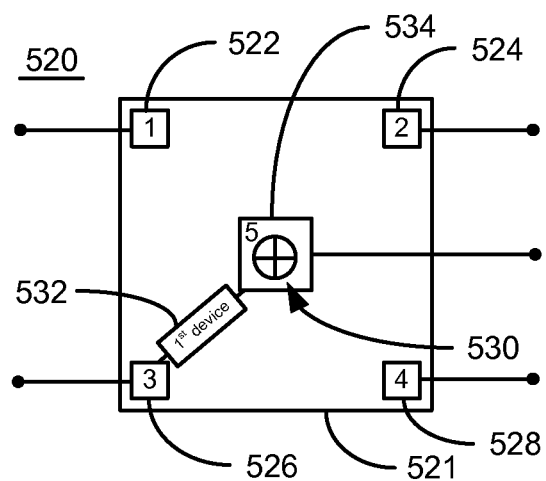
Figure 5C:
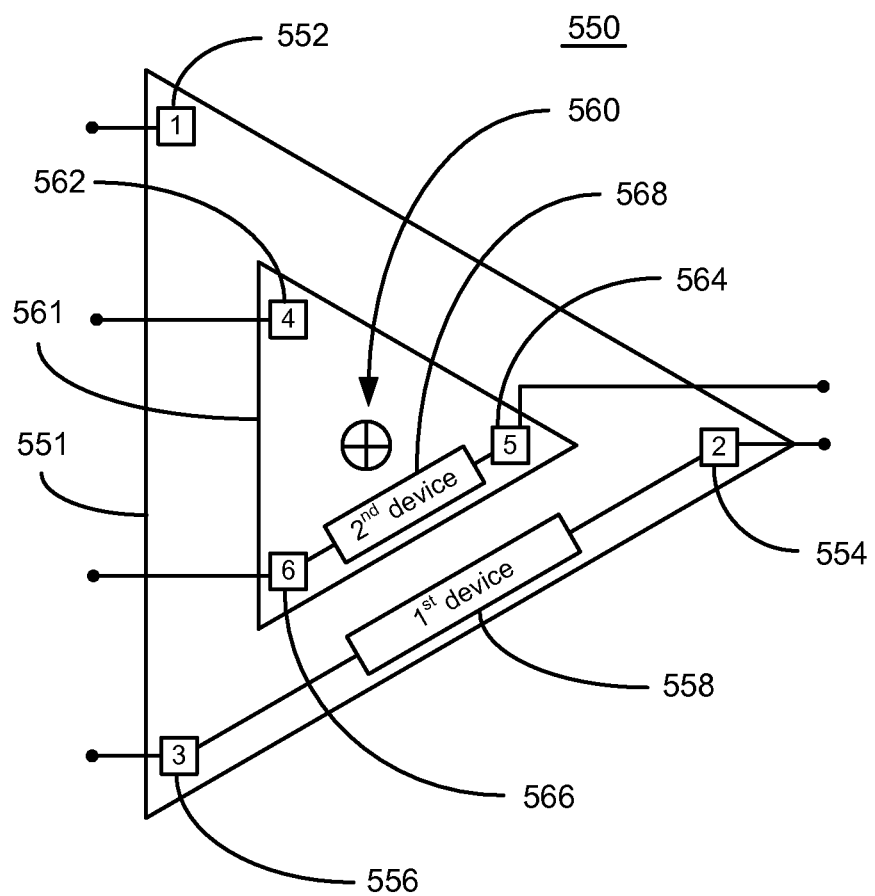

FIG. 5A-5C are illustrations of alternative embodiments of passive electrical component arrangements. FIG. 5A shows a passive electrical component arrangement 500 comprising four electrical pads. More specifically, a first electrical pad 502, a second electrical pad 504, a third electrical pad 506 and a fourth electrical pad 508, each disposed at the corners of a square substrate 501. The third pad 506 and the fourth pad 508 are electrically electrically connected via at least a first electrical device 512 fixedly attached to the third pad 506 and the fourth pad 508. The first pad 502 and the second pad 504 are devoid of any contact with any other pad via the component 500. The component 500 can be identifiably placed, in the virtual sense by a CAD program or in the actual construction of an electrical board assembly, based on an origin location 510.

FIG. 5B shows another alternative embodiment of a passive electrical component arrangement 520 comprising five electrical pads. More specifically, a first electrical pad 522, a second electrical pad 524, a third electrical pad 526, a fourth electrical pad 528 and a fifth electrical pad 534, wherein pads one, two, three and four 522, 524, 526 and 528, respectively, are disposed at the corners of a square substrate 521 and the fifth pad 534 is disposed in the center of the substrate 521. The third pad 526 and the fifth pad 534 are electrically connected via at least a first electrical device 532 fixedly attached to the third pad 526 and the fifth pad 534. Pads one, two, three and four 522, 524, 526 and 528, respectively, are devoid of any contact with any other pad via the component 520. The component 520 can be identifiably placed, in the virtual sense by a CAD program or in the actual construction of an electrical board assembly, based on an origin location 530, which is located substantially where the fifth pad 534 is disposed.

FIG. 5C shows another alternative embodiment of a passive electrical component arrangement 550. As illustrated, the component 550 comprises a first electrical pad 552, a second electrical pad 554, a third electrical pad 556, a fourth electrical pad 562, a fifth electrical pad 564 and a sixth electrical pad 566. The first, second and third pads, 552, 554 and 556, respectively, are disposed in an outer triangular arrangement on a first triangular substrate 551 and the fourth, fifth and sixth pads 562, 564 and 566, respectively, are disposed in an inner triangle arrangement on a second triangular substrate 561. In an alternative embodiment, the pads 552, 554, 556, 562, 564 and 566 can be arranged as shown herein and disposed on a single substrate. The second pad 554 and the third pad 556 are electrically electrically connected via a first electrical device 558 fixedly attached to the second pad 554 and the third pad 556. The fifth pad 564 and the sixth pad 566 are electrically electrically connected via a second electrical device 568 fixedly attached to the fifth pad 564 and the sixth pad 566. The first pad 552 and the fourth pad 562 are devoid of any contact with any other pad via the component 550. The component 550 can be identifiably placed, in the virtual sense by a CAD program or in the actual construction of an electrical board assembly, based on an origin location 560, which is located substantially in the center of the component 550.

Figure 6A:
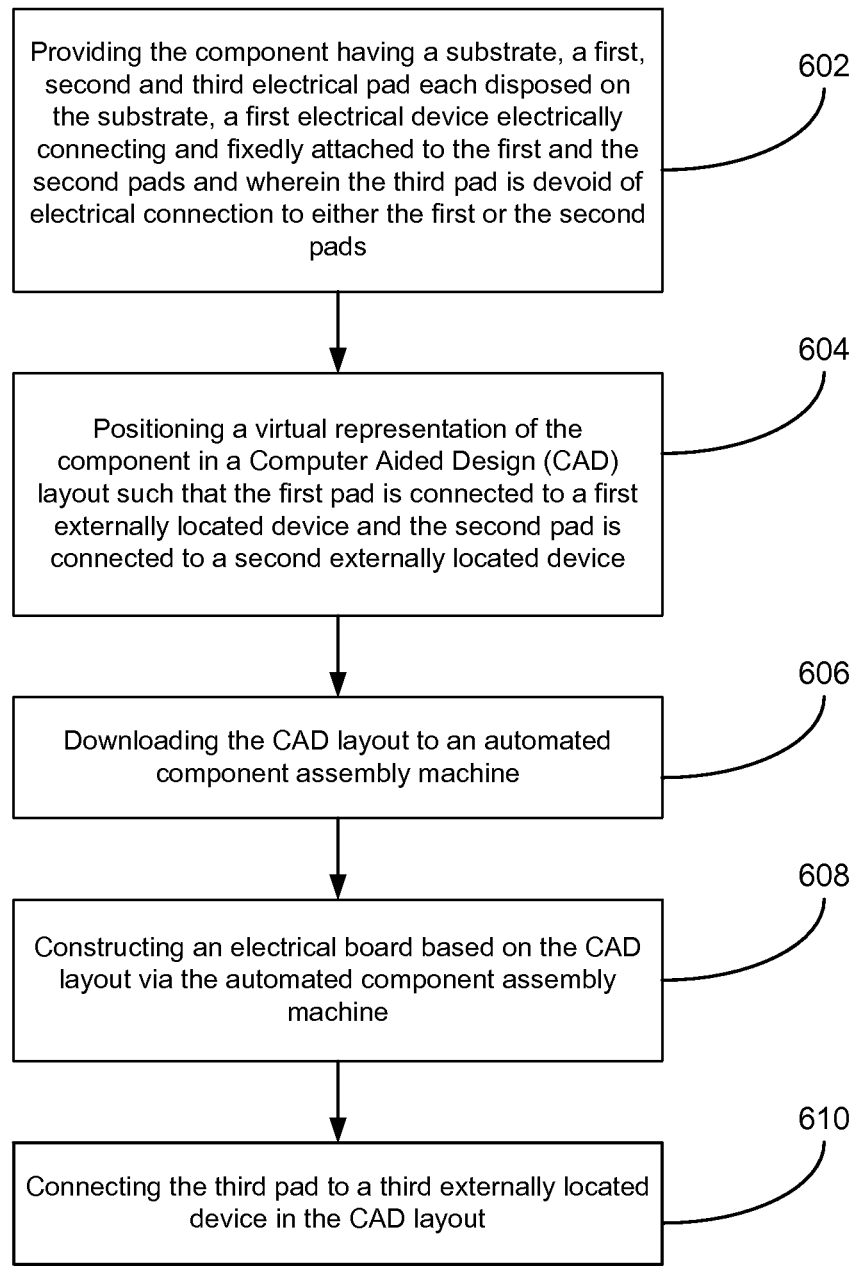
FIG. 6A-C are flow charts of method acts that are consistent with certain embodiments of the present invention.

Referring now to FIG. 6A; shown therein is a method to practice using a switchable passive electrical component consistent with embodiments of the present invention. It should be recognized that the steps presented in the described embodiments of the present invention do not require any particular sequence unless otherwise stated. Also, similar elements are used from FIGS. 3A-3C for purposes of illustration in this embodiment but are not intended to limit the methods presented herein the elements of FIGS. 3A-3C. As indicated in block 602, a passive electrical component 200 is provided with a substrate 201, a first, second and third electrical pad 202, 204 and 206, respectively, each disposed on the substrate 201, a first electrical device 208 electrically connecting and fixedly attached to the first and the second pads 202 and 204. The third pad 206 is devoid of electrical connection to either the first or the second pads 202 and 204. Block 604 identifies an act of positioning a virtual representation of the component 200 in a Computer Aided Design (CAD) layout such that the first pad 202 is electrically connected to a first externally located electrical device 312 and the second pad 204 is electrically connected to a second externally located electrical device 316. As can be appreciated by a skilled artisan, a CAD layout can include hundreds, if not thousands, of electrical components of various configurations and functions. Block 606 identifies an act of downloading the CAD layout, component 200 included, to an automated component assembly machine (not shown). Block 608 indicates the act of constructing a physical electrical board based on the CAD layout via the automated component assembly machine. Block 610 identifies an act of connecting the third pad 206 to a third externally located electrical device 314. As previously discussed, an external device, such as the first external device 312, can be a device that generates a high speed signal, such as a something having a rise time in the vicinity of less than 1 nano-second.

Figure 6B:
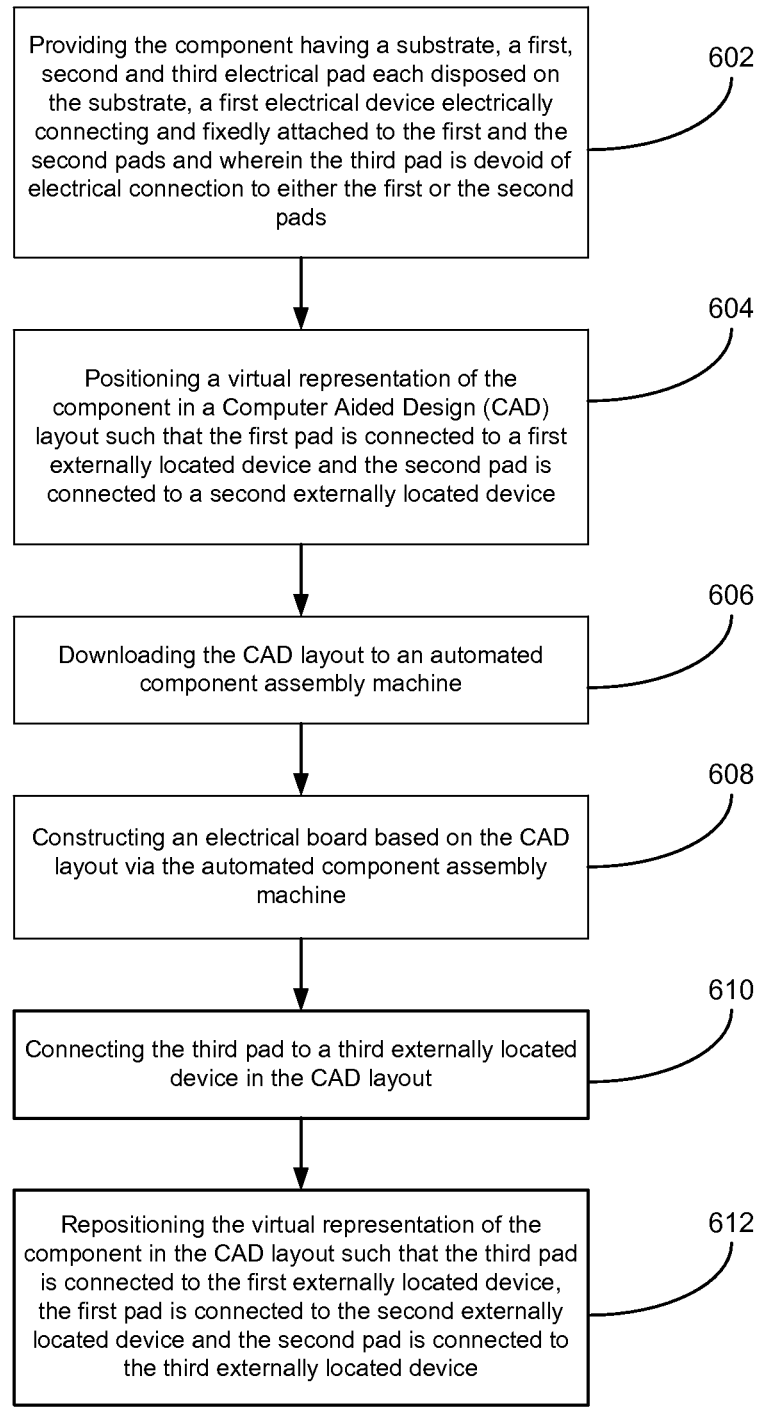

FIG. 6B is an alternative embodiment of the present invention which includes all of the acts 602, 604, 606, 608 and 610 of FIG. 6A but further includes an act 612 of repositioning the virtual representation of the component 200 in the CAD layout such that the third pad 206 is electrically connected to the first externally located device 312, the first pad 202 is electrically connected to the second externally located device 316 and the second pad 204 is electrically connected to the third externally located device 314. This is illustrated in FIG. 3A and, as shown in FIG. 6B, can be accomplished by rotating the component 200 about the point of origin 210 in a CAD program in a CAD layout design, connecting the external devices 312, 314 and 316 as shown and then building a Printed Circuit Board Assembly (PCBA) from the layout design.

Figure 6C:
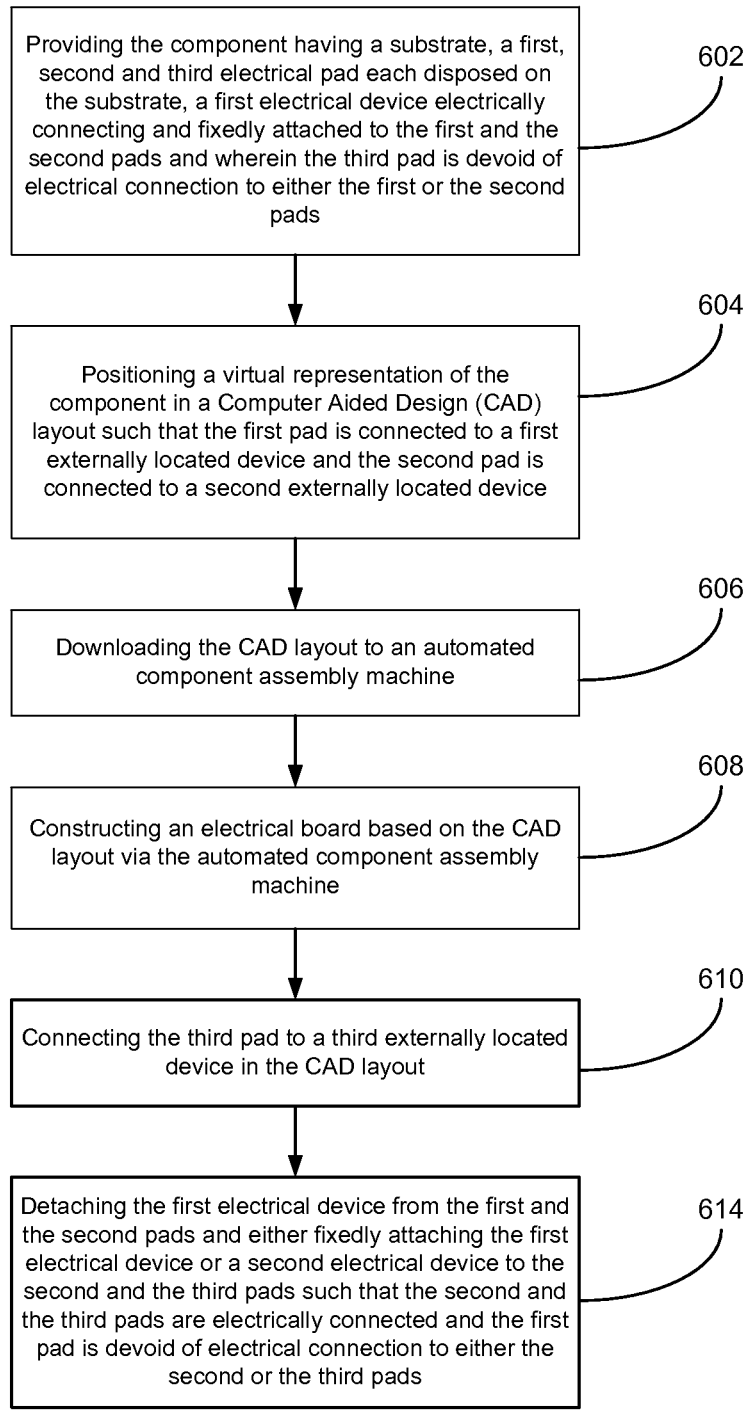

FIG. 6C is another alternative embodiment of the present invention which includes all of the acts 602, 604, 606, 608 and 610 of FIG. 6A but further includes an act 614 detaching the first electrical device 208 from the first and the second pads 202 and 204 and either fixedly attaching the first electrical device 208, as shown in FIG. 3B, or a second electrical device 220, as shown in FIG. 3C, to the second and the third pads 204 and 206 such that the second and the third pads 204 and 206 are electrically connected and the first pad 202 is devoid of electrical connection to either the second or the third pads 204 and 206. The first device 208 can be detached by cutting the first device 208 from the substrate 201 or if soldered in place, melting solder joints and removing the first device 208. If the first device 208 is damaged during the detaching process, a second device 220 may be required.

Figure 7:
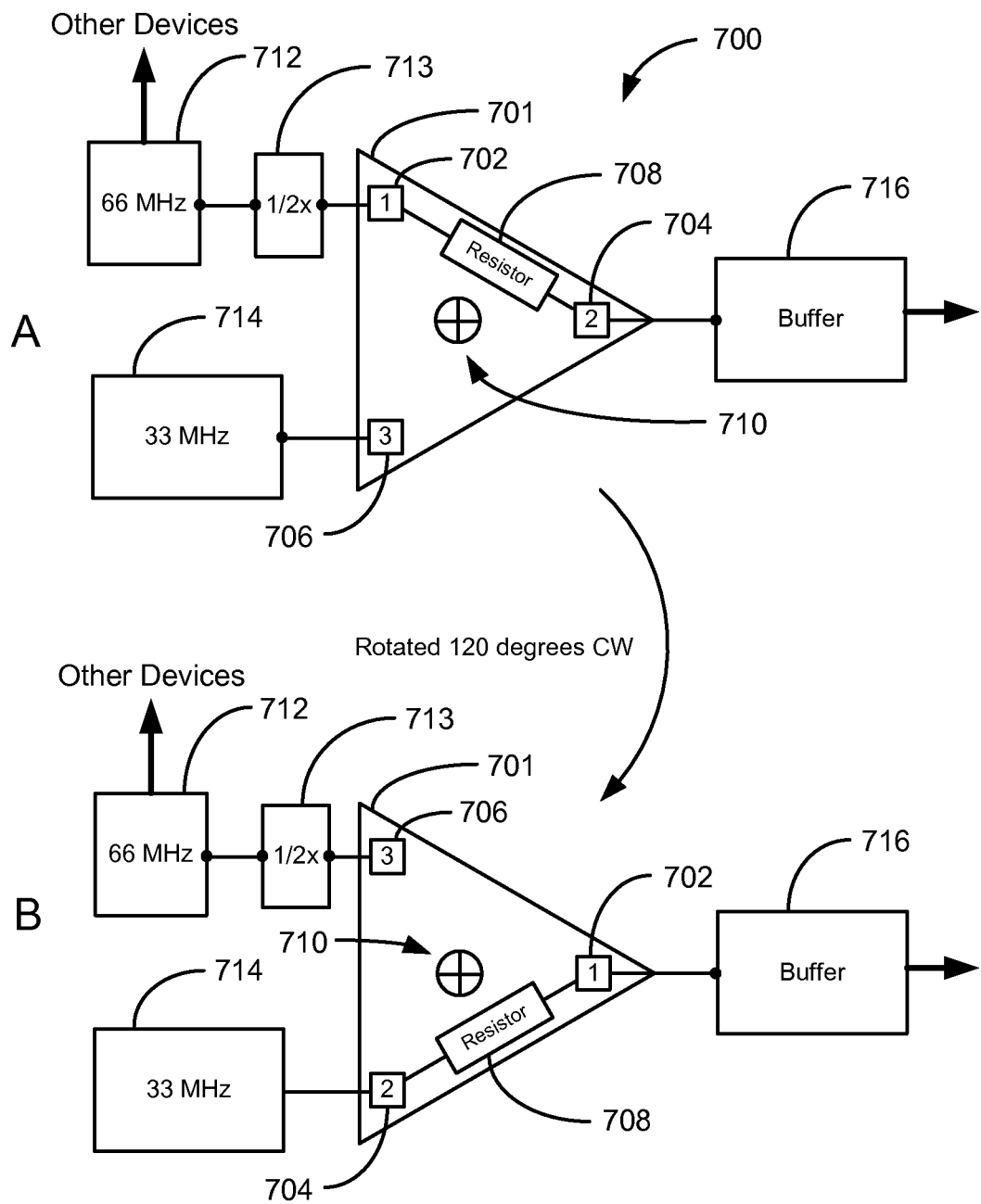
FIG. 7 illustrates in a block diagram format a commercial embodiment of a passive electrical component arranged with external components consistent with embodiments of the present invention.

Embodiments of the present invention can be commercially practiced in a Spectra Logic tape library bridge processor circuit board prototype manufactured by Spectra Logic of Boulder, Colo. The bridge processor circuit board prototype can include at least one passive electrical component 700 arranged as shown in FIG. 7 to facilitate a variety of different circuit board solutions such as improving iterative "tuning" of the design without significant loss of time due to circuit board reconstruction. The passive electrical component 700 can provide flexibility with circuit board design options after the circuit board has been fabricated, such as postponing some electrical design decisions. Furthermore, passive electrical components, such as the component 700, can provide improved materials management, such as a bill of materials reel or other inventory disposition arrangement, over the nuisance of excessive parts with noise generating stubs as discussed in conjunction with FIGS. 1A and 1B. The passive electrical component arrangement of FIG. 7 can advantageously provide a minimally altered circuit board design after the circuit board prototype has been optimized.

As illustrated in FIG. 7, a passive electrical component 700, electrically connected with external electrical devices, is shown constructed with two optional arrangements, namely arrangements A and B. Arrangement A (the upper arrangement) illustrates a 66 MHz generating clock device 712 that is halved to 33 MHz by a clock divider device 713 when electrically connected in series. The 33 MHz signal is provided to an external buffer device 716 electrically connected to the 66 MHz clock device 712 and clock divider device 713 via a first pad 702, a second pad 704 and a 20-ohm resistor element 708. A 33 MHz generating clock device 714 is electrically connected to a third pad 706. The 33 MHz clock device 714 is not linked to either the 66 MHz clock device 712, the clock divider device 713 or the external buffer device 716. The 66 MHz clock device 712 provides a 66 MHz signal that is used by other devices, however in this embodiment, the buffer device 716 requires a 33 MHz clock signal, and therefore, the 66 MHz clock signal is halved by the clock divider device 713. The non-divided 33 MHz clock device 714 is constructed on the prototype board for potential use by the component 700 in the event the 66 MHz clock device 712 and the clock divider device 713 is suboptimal (such as the potential for phase relationship problems, for example).

In the event, arrangement A is indeed suboptimal, arrangement B (the lower arrangement) can provide a simple design change without any change to the footprint (i.e., the component layout arrangement) on a PCBA of arrangement A. Furthermore, arrangement B provides a solution wherein the component 700 has balanced, or similar, characteristic impedance between arrangement A and B, due to a differential signal relative a ground plane associated with the substrate 701, and further provides a low angle electrical path, and hence low noise often caused by right angle electrical paths, between the clock devices 712 and 714 and the buffer device 716. As is illustrated in arrangement B, the component 700 can simply be rotated 120° clockwise about the origin location 710 in Expedition PCB CAD program by Mentor Graphics Co. of Wilsonville, Oreg. 97070, and virtually constructed as shown in arrangement B. Also, as shown in arrangement B, the 66 MHz clock device 712 and clock divider device 713 is electrically connected to the third pad 706, the external buffer device 716 is electrically connected to the first pad 702 and the 33 MHz clock device 714 is electrically connected to the second pad 704. The 33 MHz clock device 714 is electrically linked with external buffer device 716 via the resistor 708 and first and second pads 702 and 704, respectively. The 66 MHz clock device 712 and clock divider device 713 are not linked to either the 33 MHz clock device 714 or the external buffer device 716. The CAD representation can then be downloaded to a Pick and Place circuit board assembly machine, such as by Panasonic located in Osaka, Japan and constructed on a new circuit board in arrangement B. Optionally, arrangement A can be provided with an open space in the place of the 33 MHz component 714 in anticipation of a component different from the 33 MHz component 714. In yet another optional embodiment, the resistor 708 of arrangement A can be removed and replaced in the arrangement B, resembling the pad layout in arrangement B of FIG. 3B.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, alternate board layouts and features specific to design needs can be used with a passive electrical component consistent with embodiments of the present invention, such as the passive electrical component 200 for example, while still maintaining substantially the same functionality without departing from the scope and spirit of the present invention. Another example can include various external devices that are not necessarily high speed components electrically connected to the passive electrical component while still maintaining substantially the same functionality without departing from the scope and spirit of the present invention. Although the preferred embodiments described herein are directed to high speed external components, such as a clock device 714, an internal resistor component, such as the resistor 708, and other related componentry, it will be appreciated by those skilled in the art that the teachings of the present invention can be applied to other systems and storage media, without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed.

What is claimed is:

1. A passive electrical component comprising:
   a substrate;
   at least a first, second and third electrically conductive pad, each disposed on said substrate;
   a first electrical device fixedly attached to said first pad and said second pad and making an electrical connection therebetween,
   said third pad devoid of electrical connection to either said first or said second pads and wherein said first electrical device is not physically attached to said third pad, said passive electrical component oriented in a first position where said first conductive pad to be electrically connected to a first electrical component, said second conductive pad to be electrically connected to a second electrical component, said third conductive pad to be electrically connected to a third electrical component, said passive electrical component adapted to be reoriented in a second position where said first electrical component is electrically connected to said third conductive pad, said second electrical component is electrically connected to said first conductive pad and said third electrical component is electrically connected to said second conductive pad, said electrical components in a location external from said substrate, and
   said passive electrical component is recognizable as an independent component by both a computer aided design program and an automated component assembly machine.

2. The passive electrical component of claim 1 wherein said first, second and third pads are arranged in a substantially triangular array.

3. The passive electrical component of claim 2 wherein said pads are arranged in a substantially equilateral triangular array.

4. The passive electrical component of claim 1 wherein said first, second and third pads are arranged in a substantially equilateral triangular planar array and wherein said passive electrical component is repositionable by rotating said passive electrical component about an origin location substantially coplanar with said pads, said origin location associated with said passive electrical component.

5. The passive electrical component of claim 1 wherein said first and said third electrical components produce a high speed signal with a rise time of less than 1 nano-second.

6. The passive electrical component of claim 1 where said passive electrical component is sealed.

7. The component of claim 1 wherein said component comprises a fourth electrically conductive pad and a fifth electrically conductive pad, wherein each of said fourth and fifth pads is disposed on said substrate, and wherein each of said fourth and fifth pads are devoid of electrical contact with any other of said first, second and third pads.

8. The passive electrical component of claim 1 wherein said first electrical device consists essentially of a resistor.

9. The passive electrical component of claim 1 wherein said first electrical device is fixedly attached via solder joints.

10. The component of claim 1 wherein said component comprises at least a fourth electrically conductive pad and a fifth electrically conductive pad, wherein each of said fourth and fifth pads is disposed on said substrate and at least a second electrical device fixedly attached to said fourth pad and said fifth pad, said second electrical device electrically connecting said fourth pad with said fifth pad.

11. A component with a passive alterable electrical pathway, said component comprising:
   at least a first, second and third electrically conductive pad;
   at least a first electrical device fixedly attached to said first pad and said second pad and making an electrical connection therebetween, said third pad devoid of electrical connection to either said first or said second pads and said third pad not physically connected to said first electrical device; and a substrate supporting said first, second and third pads, said substrate moveable between a first orientation and a second orientation, said first orientation having a first external device electrically connected to said first pad, a second external device electrically connected to said second pad and a third external device electrically connected to said third pad, wherein said first external device is electrically linked to said second external device and said third external device is devoid of any electrical link via said component to either said second external device or said first external device, said second orientation having said second external device electrically connected to said first pad, said third external device electrically connected to said second pad and said first external device electrically connected to said third pad wherein said third external device is electrically linked to said second external device and said first external device is devoid of any electrical link via said component to either said second external device or said third external device.

12. The passive electrical component of claim 11 wherein said component is moveable between said first orientation and said second orientation by rotating about a point of origin.

13. The passive electrical component of claim 11 wherein said component is adapted for implementation with a Computer Aided Design program.

14. A component comprising:
a substrate possessing a first pad, a second pad and a third pad;
an electrical device fixedly attached to said first pad and said second pad and making an electrical connection therebetween, said electrical device not attached or electrically connected to said third pad;
said component adapted to be electrically connected to a first external device via said first pad, a second external device via said second pad and a third external device via said third pad whereby an electrical pathway exists between said first external device and said second external device, no electrical pathway exists for said third external device via said third pad, and
a datum point that said component rotates about to facilitate said third external device to be connected to said second pad and said second external device to be connected to said first pad thus creating said electrical pathway between said third external device and said second external device.

15. The component of claim 14 wherein said component possesses a datum point that said component rotates about to facilitate physical connection for said first external device via said first pad, said second external device via said second pad and said third external device via said third pad whereby said electrical pathway exists between said first external device and said second external device, and wherein no electrical pathway exists for said third external device via said third pad.

16. The component of claim 14 wherein said third pad never facilitates electrical connectivity with said first and said second pads.

17. The component of claim 14 wherein said substrate is for accommodating said an electrical device only capable of attaching to two of said pads.

18. The component of claim 14 wherein a circuit board assembly accommodates said component.

19. A primary electrical component comprising:
a substrate possessing a first pad, a second pad and a third pad, wherein said pads are all electrically conductive;
an electrical device fixedly attached to said first pad and said second pad and making an electrical connection therebetween,
said third pad devoid of electrical connection to either said first or said second pads and wherein said first electrical device is not physically attached to said third pad,
said primary electrical component in a first position is arranged to be electrically connected to a first external electrical component via said first pad, a second external electrical component via said second pad and a third external electrical component via said third pad wherein said first, second, and third electrical components are located essentially beyond the perimeter of said substrate,
said primary electrical component in a second position is arranged to be electrically connected to said first external electrical component via said third pad, said second external electrical component via said first pad and said third external electrical component via said second pad.

* * * * *